(12) United States Patent
Bexten et al.

(10) Patent No.: US 6,412,502 B1
(45) Date of Patent: *Jul. 2, 2002

(54) WAFER CONTAINER CLEANING SYSTEM

(75) Inventors: Daniel P. Bexten; Jerry R. Norby, both of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/611,642

(22) Filed: Jul. 7, 2000

Related U.S. Application Data

(63) Continuation-in-part of application No. 09/362,157, filed on Jul. 28, 1999, now Pat. No. 6,322,633.

(51) Int. Cl.$^7$ .............................. B08B 3/00; B08B 3/04
(52) U.S. Cl. ......................... 134/148; 134/61; 134/80; 134/104.1; 134/158; 134/184; 134/902
(58) Field of Search ................................ 134/61, 104.1, 134/158, 184, 80, 148, 902

(56) References Cited

U.S. PATENT DOCUMENTS 5,672,212 A    9/1997    Manos
5,738,128 A    4/1998    Thompson et al.

OTHER PUBLICATIONS

Exhibit A, 1995.*
Exhibit B, 1997.*

* cited by examiner

*Primary Examiner*—Zeinab El-Arini
(74) *Attorney, Agent, or Firm*—Lyon & Lyon LLP

(57) ABSTRACT

A cleaning system for cleaning boxes or containers used to carry semiconductor wafers has box holder assemblies and a box door holder assembly attached to a rotor within an enclosure. Upper and lower hooks on the box holder and box door holder assemblies hold boxes and doors as the rotor spins. Boxes and their doors, such as front opening unified pods (FOUP) are both efficiently cleaned and handled.

21 Claims, 10 Drawing Sheets

WAFER CONTAINER CLEANING SYSTEM

This Application is a Continuation-In-Part of Ser. No. 09/362,157, filed July 28, 1999, now U.S. Pat. No. 6,322,633, and incorporated herein by reference.

BACKGROUND OF THE INVENTION

Field of the Invention

The field of the invention is cleaning apparatus for cleaning carriers used to hold and process semiconductor wafers, substrates, flat panel displays and similar flat articles requiring low contamination levels.

The processing of semiconductor wafers, substrates, photomasks, flat panel displays, data disks, optical media and other articles relating to the semiconductor industry (collectively referred to here as "wafers") is very sensitive to problems of contamination. These articles require extremely low contamination levels. Even tiny contaminants can cause defects. Accordingly, it is necessary to maintain a high level of cleanliness during virtually all stages of manufacture.

Semiconductor wafers are typically processed in batches. Batch handling may occur throughout the entire production process, or for one or more processing steps or related handling operations. Batch processing almost always uses some type of carrier to hold the wafers. The wafer carriers can be of various designs. Carriers in the form of a protective case or box are often used. In these types of carriers, the wafers are held and enclosed against contamination during travel within the processing facility. The wafer carriers must be cleaned, to avoid having particles and contaminants on the carriers contaminate the wafers. However, cleaning wafer carrying boxes can be difficult because they typically have features such as slots, grooves or apertures.

One type of wafer carrier is known as the front opening unified pod, or FOUP. A FOUP carrier has a five-sided box with an open front. A door attaches to the front of the box, to seal the box against entry of external contaminants, to help keep the wafers clean. The door has a latch mechanism, which is typically adapted to be engaged and operated automatically via robots or other automatic machinery. The latch mechanism is largely contained within hollow spaces within the door. The hollow spaces within the door, and other interior door features, make cleaning the FOUP door difficult, using conventional techniques. The hollow areas trap water or other cleaning fluids. Accordingly, improved apparatus and techniques are needed for cleaning FOUP doors.

Box carriers have been successfully cleaned in centrifugal cleaners. See, for example, U.S. Pat. No. 5,738,128, incorporated herein by reference. In these centrifugal cleaners, the box is loaded onto a rotor, with the open top or front side of the box facing radially outwardly from the rotor. The box is then sprayed with cleaning fluids, and then with drying gases, while the rotor turns. Centrifugal force helps to remove cleaning fluids from the box, to help dry it. While these techniques have worked well for different types of boxes, FOUP carriers have larger five-sided boxes. Accordingly, FOUP boxes cannot be readily loaded onto, or securely held in place on, a conventional rotor in a centrifugal box cleaner. Accordingly, an improved centrifugal box cleaner is needed for use with FOUP boxes.

As FOUP carriers include a box and a separate door, which must both be cleaned, a system for efficiently cleaning both of these components of a FOUP container is also needed.

SUMMARY OF THE INVENTION

In a first aspect of the invention, an apparatus for cleaning a door of a wafer carrier includes an ultrasonic transducer within a cleaning tank. An elevator supports a base adapted to hold several doors, with the elevator lifting the doors into and out of the cleaning tank. A tank lid is advantageously attached to the elevator, and seals the tank, when the base is lowered into the tank. The doors are effectively cleaned, notwithstanding their hollow spaces and other difficult-to-clean features.

In a second and separate aspect of the invention, a centrifugal cleaner for cleaning carrier boxes has a rotor within an enclosure. A box holder on the rotor includes upper and lower hooks. An upper front edge of the box is placed behind the upper hooks. The box is rotated into position, and secured on the rotor by the upper and lower hooks. Accordingly, the box is installed and secured onto the rotor without the need for moving latches or other securing components.

In a third and separate aspect of the invention, a system for cleaning carriers used for handling semiconductor wafers includes a box cleaner having a rotor within an enclosure. Box holder assemblies on the rotor include upper and lower hooks for securing boxes to the rotor. A door cleaner is advantageously located adjacent to the box cleaner. The door cleaner has an ultrasonic transducer within a cleaning tank. An elevator moves doors into and out of the cleaning tank. The boxes and doors are efficiently cleaned and handled at a single location.

In a fourth and separate aspect of the invention, a box door holder assembly is provided on the rotor. The box door holder assembly preferably has a plurality of box door holding positions. Each box door holding position advantageously has a door guide and door hooks for holding a door. The box door holder assembly allows both the boxes and their doors to be cleaned with the centrifugal cleaner, avoiding the need for separate cleaning of the doors.

Other and further objects, inventive features, and advantages, will appear hereinafter. The invention resides as well in subcombinations of the features described.

BRIEF DESCRIPTION OF THE DRAWINGS

In the drawings, wherein the same reference number denotes the same element, throughout the several views.

DETAILED DESCRIPTION OF THE DRAWINGS

Figure 1:
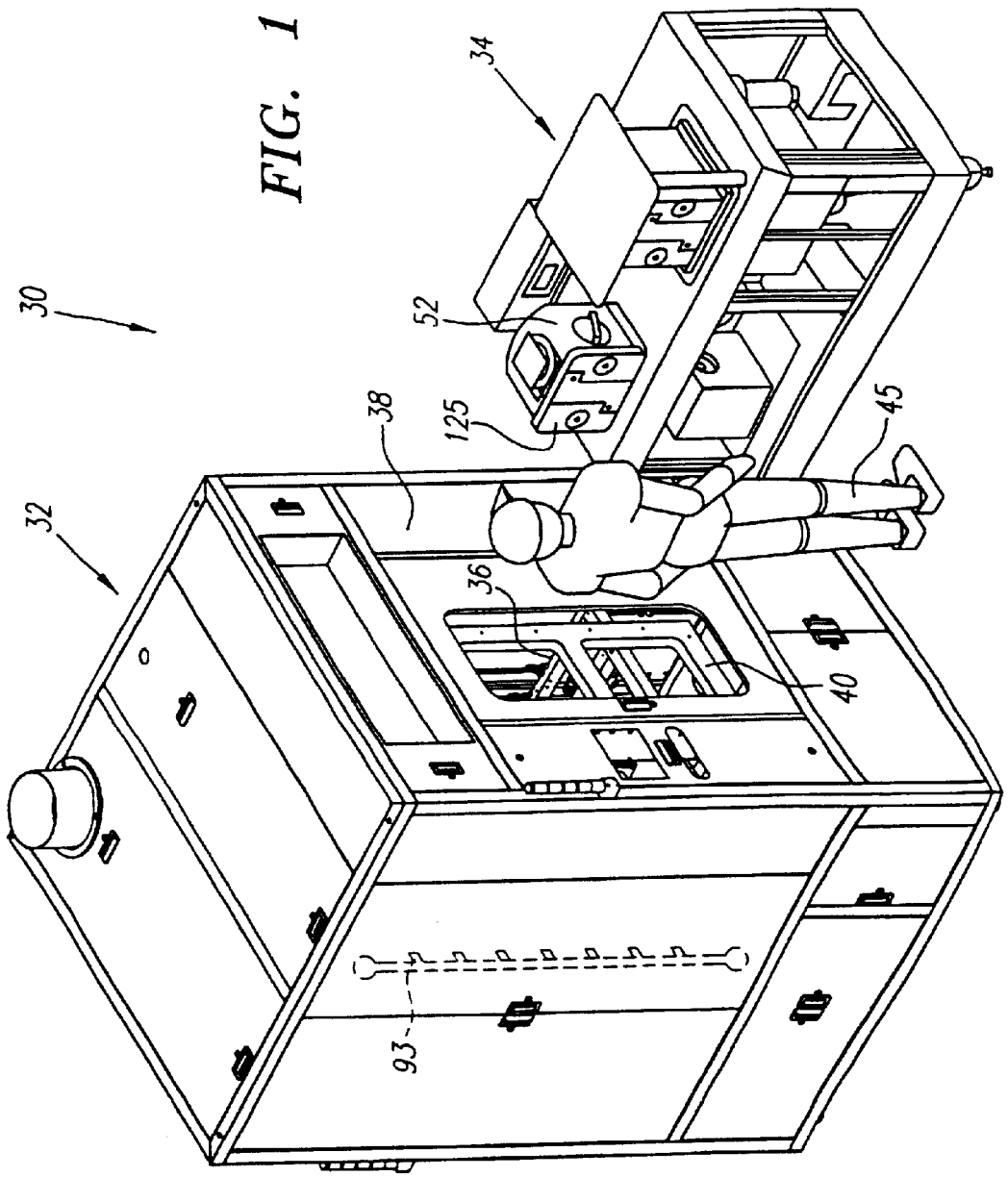
FIG. 1 is a perspective view of a system for cleaning carrier boxes and carrier doors, used in handling semiconductor wafers and similar articles.

Turning now in detail to the drawings, as shown in FIG. 1, a carrier cleaning system 30 includes a centrifugal box cleaner 32, and a door cleaner 34. The door cleaner 34 is preferably located adjacent to the box cleaner 32. A rotor assembly 36 is rotatably supported within an enclosure 38 of the box cleaner 32. The rotor assembly 36 is accessed via an enclosure door 40, which slides open for loading and unloading, and slides closed during cleaning.

Spray nozzles 93 are directed inwardly to spray water, water and detergent, solvents, mixtures thereof, or other cleaning liquids generally inward or directly toward the center axis of the processing chamber.

Figure 2:
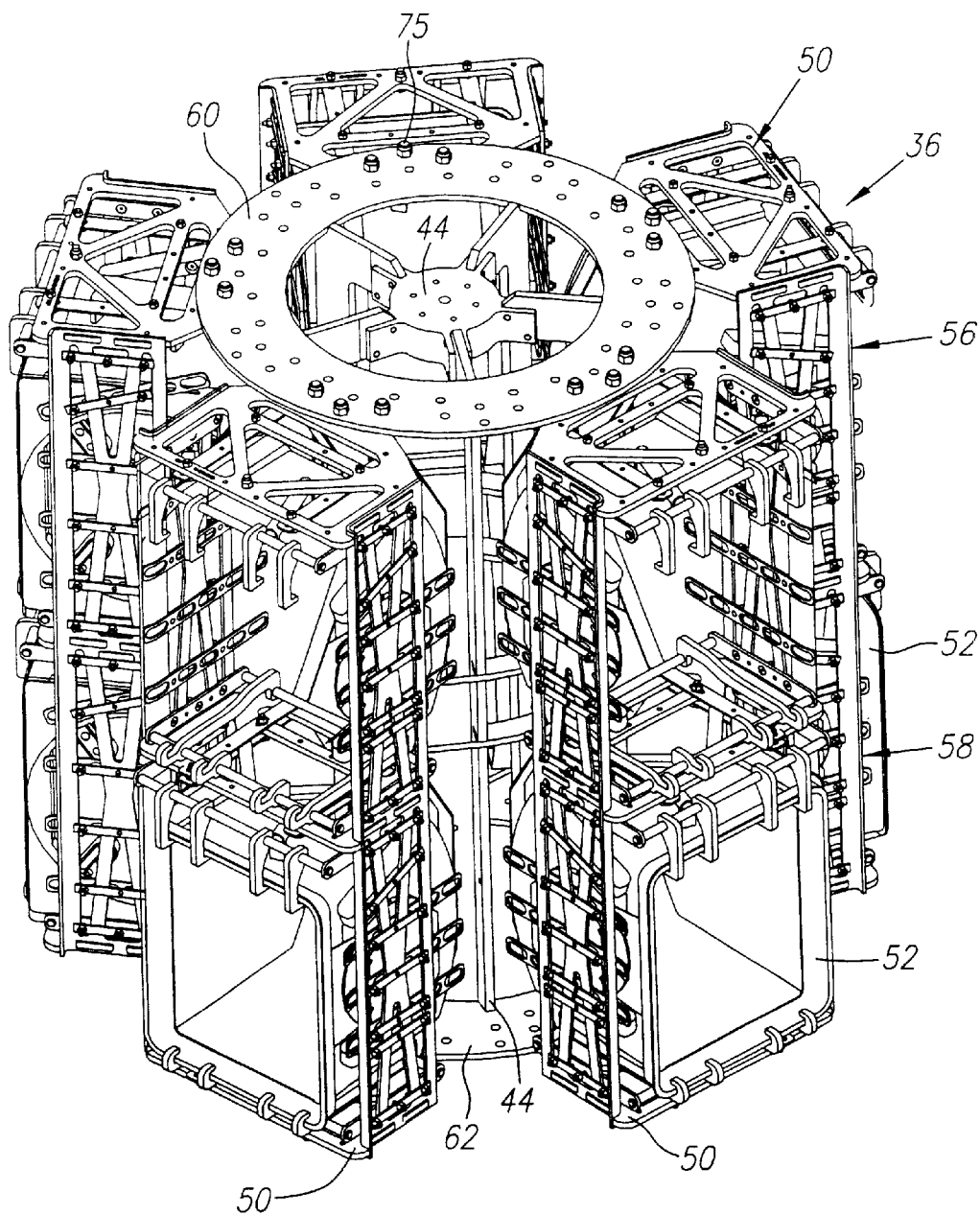
FIG. 2 is a perspective view of the rotor within the box cleaner shown in FIG. 1.
Figure 3:
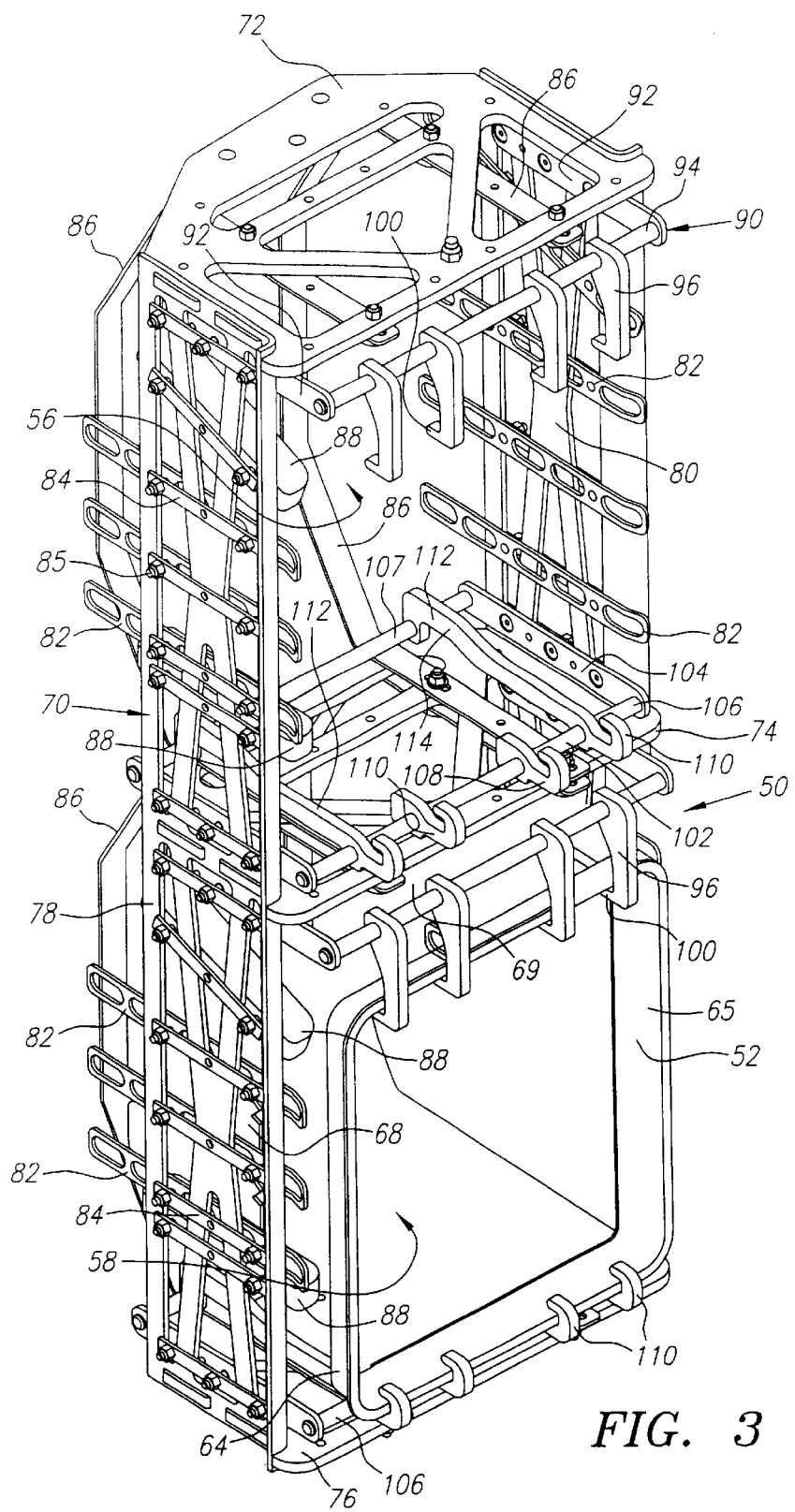
FIG. 3 is an enlarged perspective view of the box holder assemblies shown in FIG. 2.
Figure 4:
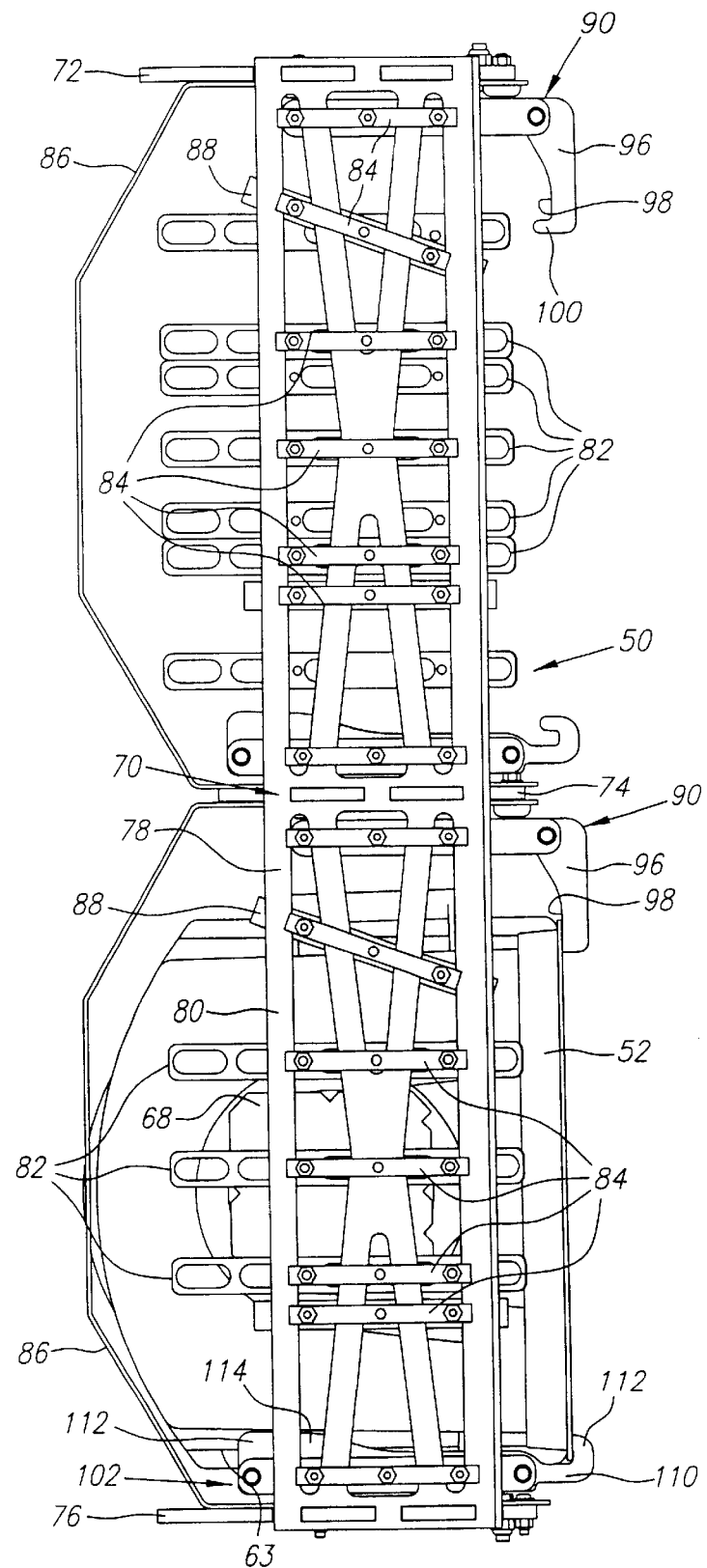
FIG. 4 is a side elevation view thereof.

Turning to FIGS. 2, 3 and 4, box holder assemblies 50 are attached to, and form part of, the rotor assembly 36, within the box cleaner 32. The rotor assembly 36 has a top ring plate 60 and a bottom ring plate 62 attached to a core structure 44. The holder assemblies 50 are rigidly attached to the top and bottom ring plates 60 and 62 via bolts 75.

Referring to FIGS. 3 and 4, each holder assembly 50 has a top plate 72, a middle plate 74, and a bottom plate 76 joined to side plates 78 and 80. An upper box position 56 is formed between the top plate 72 and the middle plate 74. Similarly, a lower box position 58 is formed between the middle plate 74 and the bottom plate 76.

A plurality of side bumpers 82 are attached to the inside surfaces of the side plates 78 and 80, via clamp brackets 84, on the outside surfaces of the side plates 78 and 80, and via fasteners 85 extending through the side bumpers 82, clamp brackets 84, and optionally also through the side plates 78 and 80. Upper and lower misload bumpers 88 are attached to the inside surface of the side plate 78. As shown in FIG. 3, the upper misload bumper 88 in both the upper box position 56 and the lower box position 58 is angled downwardly towards the front opening of each box position 56 and 58, while the lower misload bumper 88 is generally horizontal, in each box position 56 and 58.

As best shown in FIG. 4, a pair of spaced apart rear guides 86 are attached to the top plate 72 and middle plate 74. A pair of spaced-apart rear guides 86 are also similarly attached to the middle plate 74 and bottom plate 76. The rear guides 86 extend rearwardly behind the side plates 78 and 80, in a semi-octagonal configuration.

Referring to FIG. 3, an upper hook assembly 90 has arms 92 attached to the side plates 78 and 80. A crossbar 94 extends between the arms 92. Hooks 96 extend downwardly from the crossbar 94. As better shown in FIG. 4, each hook 96 has a downwardly extending leg 98, and a foot 100 substantially perpendicular to the leg 98, and extending inwardly.

Turning back to FIG. 3, a lower hook assembly 102 similarly has arms 104 attached to the side plates 78 and 80. A front crossbar 106 extends between the arms 104. Center hooks 108 mounted on the crossbar 106 each have an inwardly extending foot 110. Base bars 112, positioned to the outside of the hooks 108, are supported on the front crossbar 106, and also on a rear crossbar 107 attached to the arms 104. Each base bar 112 has a ramp section 114, which ramps upwardly from the front crossbar 106 to the rear crossbar 107, i.e., from front to rear.

In the embodiment shown in FIG. 2, five holder assemblies 50 are equally radially spaced apart on the rotor assembly 36. Each holder assembly 50 has an upper box position 56 and a lower box position 58. Each upper and lower box position 56 and 58 has upper and lower hook assemblies 90 and 102, side bumpers 82, and misload bumpers 88, as described above.

Figure 5:
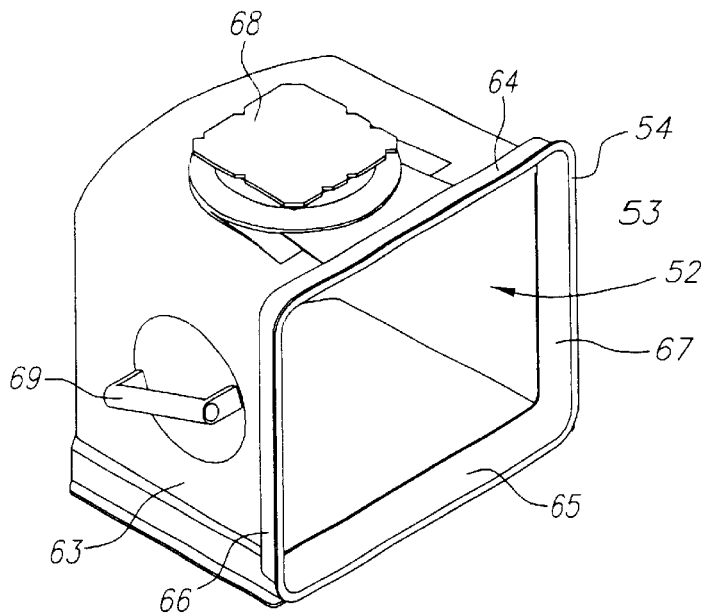
FIG. 5 is a perspective view of a carrier box.

Turning now to FIG. 5, a (FOUP) carrier box 52 has an open front 53 surrounded by a frame or bezel 54. The frame 54 has a top rim 64, a bottom rim 65 a left side rim 66, and a right side rim 67. Handles 69 are attached to side walls 63 of the box 52. A fitting 68 is attached to the top surface of the box 52, for engagement by a robot or other automatic manipulator.

Referring momentarily to FIG. 1, the box cleaner 32 is described above. The door cleaner 34, which together with the box cleaner 32 forms the container cleaning system 30, is now described.

Figures 7, 8:
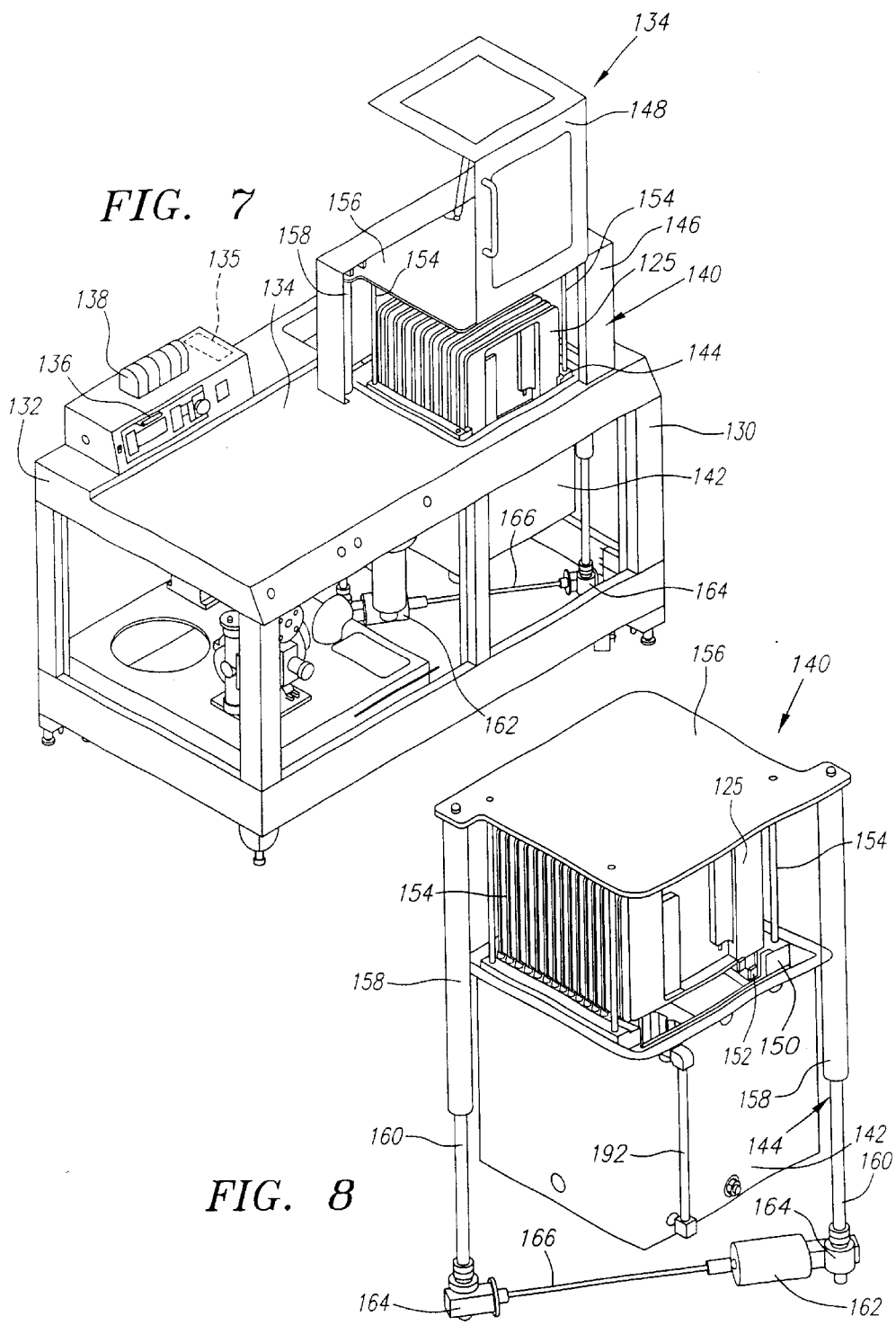
FIG. 7 is a perspective view of the carrier door cleaner shown in FIG. 1.
FIG. 8 is a perspective view of the elevator and tank shown in FIG. 7.

As shown in FIG. 7, the door cleaner 34 has a frame 130 including a bench top 132 which provides a work space 134. A control panel 136 is located at the back of the bench 132. Indicator lights 138 on the control panel 136 provide a visual indication of status of the door cleaner 34. The door cleaner 34 includes a cleaning unit 140 alongside the work space 134. The cleaning unit 140 has a process tank 142 extending downwardly from the bench surface 132. An enclosure 146 fixed to the top surface of the bench 132 is positioned over and around the tank 142. An enclosure door 148 pivotally attached to the tank enclosure 146 pivots up to allow doors 125 to be loaded into and unloaded from the cleaning unit 140. The enclosure door 148 pivots downwardly to close off the tank 142 from the surrounding environment, during cleaning.

Figure 9:
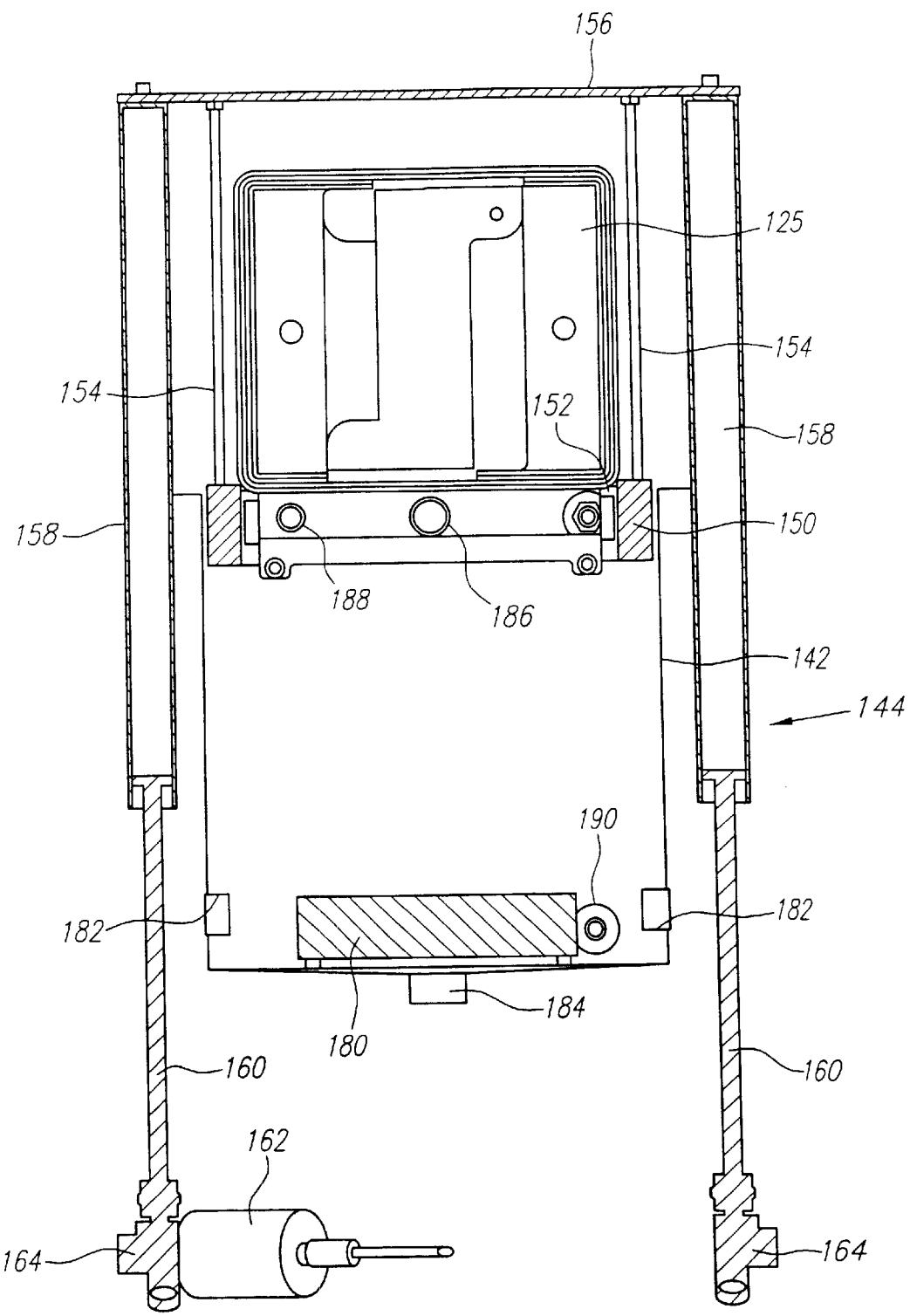
FIG. 9 is a side view thereof, in part section.

As shown in FIGS. 8 and 9, the cleaning unit 140 includes an elevator 144. The elevator has a base 150. The doors 125 are supported on the base 150 between door holder tabs 152, which hold the doors 125 upright and slightly spaced apart, on the base 150. Lift rods 154 extend upwardly from the base 150 and are attached to a tank lid 156. The tank lid 156 is in turn supported on lift tubes 158 at opposite diagonal corners. The lift tubes 158 have internal threads engaged over lead screws 160. The lead screws 160 are rotated via an elevator motor 164 turning a driveshaft 166 through right angle drives 164. As shown in FIG. 9, an ultrasonic transducer 180 is located at the bottom of the tank 142. An interlock prevents movement of the elevator when the enclosure door 148 is open.

Figure 10:
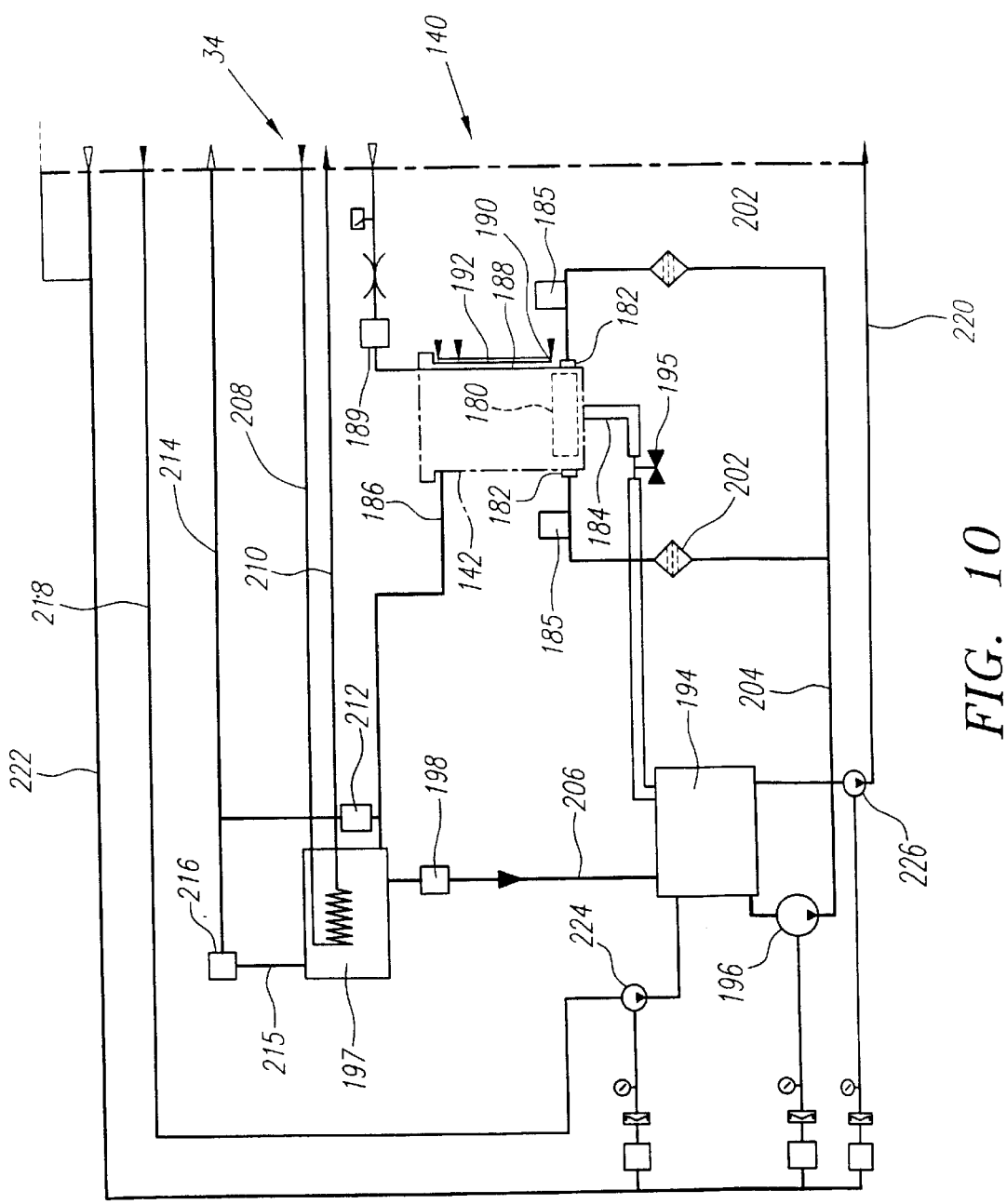
FIG. 10 is a schematic view of the door cleaner shown in FIG. 7.

As shown in FIGS. 9 and 10, a drain line 184 at the bottom of the process tank 142 connects to a reclaim tank 194 under the bench 132 on the frame 130. A fluid fill line 204 runs from the reclaim tank 194 to a delivery pump 196, then through parallel filters 202 and into fill ports 182 at the bottom of the process tank 142. A drain valve 195 controls flow from the drain 184 into the reclaim tank 194. A level sensing entry port 190 connects the process tank 142 to a level sensing tube 192 extending upwardly alongside the tank for sensing fluid level within the tank 142.

A tank vapor exhaust line 186 extends from the top of the tank 142 to an exhaust valve 212, which allows tank exhaust to flow out via an exhaust line 214, or into a vapor condenser 197. Chilled water supply and return lines 208 and 210 connect the vapor condenser 197 to a source of chilled water. A condensate return line 206 runs from the vapor condenser 197 through a breather valve 198 into the reclaim tank 194. A chemical solution supply line 218 connects into the reclaim tank 194 through a fill pump 224. A clean dry air supply line 222 connects into the fill pump 224, the delivery pump 196, and to a drain pump 226 connecting into a chemical solution drain 220, to drive the pumps pneumatically. Alternatively, electrically powered pumps may be used. A vapor condenser exhaust line 215 extends out of the vapor condenser 197, through a condenser exhaust valve 216 and into the exhaust line 214.

A nitrogen purge system 188 provides nitrogen gas through a purge valve 189, to purge the process tank 142 and the lines connecting to the tank. Via use of the nitrogen purge system 188, and the valves 212, 198, 189 and 216, ambient air and humidity can be purged from the cleaning unit 140. Purging reduces or eliminates condensed water vapor in the cleaning unit 140.

A computer controller 135 is linked to the various valves, pumps, sensors, and other components to control operations of the door cleaner 34.

Referring back to FIG. 1, in use, boxes 52 to be cleaned are transported to the container cleaning system 30. A system operator 45 typically lifts a box 52 from a cart and places the box onto the work space 134 of the door cleaner 34. The operator 45 then removes the door 125, and loads the door onto the base 150 of the elevator 144 in the door cleaner 34.

To then load the box 52 into the box cleaner 32, the operator 45 turns the rotor assembly 36, via a control panel, until an empty holder assembly 50 is aligned with the opening of the enclosure door 40. The enclosure door slides open and closed automatically via operator control of the control panel.

Figure 6:
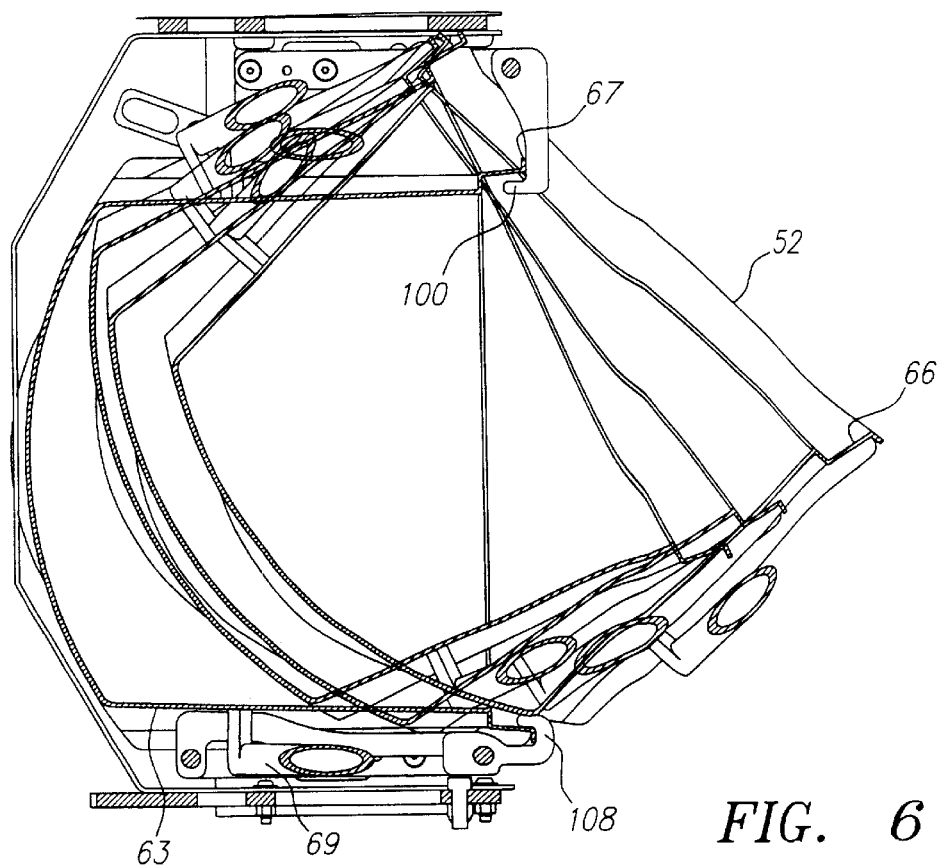
FIG. 6 is a side view, in part section, showing the load sequence of the box shown in FIG. 5, into the holder assembly shown in FIGS. 3 and 4.

Referring to FIG. 6, the operator turns the box 52 so that the right side rim 67 is on top. The operator 45 then moves the box 52 into the open box position 56 or 58, with the right side rim 67 of the box 52 positioned above and behind the hooks 96. The operator 45 then continues to move the box 52 into the box position 56 or 58, by moving the box 52 through the sequence shown in FIG. 6. After the left side rim 66 of the frame 54 of the box 52 moves behind the lower hooks 108, the operator 45 moves the box 52 downwardly, so that, as shown in FIGS. 3, 4 and 6, the feet 100 on the upper hooks 96 extend under the rim 67, and the feet 110 of the lower hooks 108 extend over and engage the rim 66 of the box 52.

Referring to FIG. 6, during the loading sequence, the ramp section 114 of the base bars 112 helps to guide the box 52 into the correct position. The rear guides 86 also help to guide the box 52 into place, by preventing the box from moving too far back in the holder assembly 50. The side bumpers 82 help to guide the box 52 laterally into place. The misload bumpers 88 prevent the box 52 from being loaded into the holder 50, unless the box 52 is properly oriented. The components of the holder 50 which contact the box 52 are preferably made of materials which do not generate excessive particles, via abrasion, etc.

Following the steps described above, the operator 45 continues loading boxes 52 into empty box positions 56 and 58. The doors 125 removed from the boxes are correspondingly loaded onto the base 150 in the door cleaner 34. When all positions are loaded with a box 52, or when there are no further boxes to be cleaned, the operator 45 closes the enclosure door 40 and initiates the cleaning sequence. The rotor assembly 36 spins and cleaning fluids are sprayed onto the boxes 52. Drying gases are then used to dry the boxes 52, as described, for example, in U.S. Pat. No. 5,738,128, incorporated herein by reference. After the boxes 52 have been cleaned and dried, they are unloaded and removed from the box cleaner 32 following the reverse of the sequence of steps described above.

As each door 125 is removed from a box 52, the operator 45 manually places the door 125 onto the base 150 in the cleaning unit 140 of the door cleaner 34. The doors 125 are held vertically upright via the holder tabs 152 on the base 150. The process tank 142, at this time, is empty (filled with ambient air). In the embodiment shown, the cleaning unit 140 has a ten-door capacity. The doors 125 are spaced slightly apart by the holder tabs 152.

With the base loaded with doors, the operator 45 initiates the cleaning sequence using the control panel 136. The enclosure door 148 is closed. The elevator motor 162 is energized, lowering the base 150 and doors 125 into the tank 142. With the elevator 144 fully lowered, the tank lid 156 seals against the surrounding top surface of the bench 132. This provides a sealed cleaning unit 140, which advantageously keeps the costly cleaning fluid in, and keeps ambient air and humidity out.

The nitrogen purge valve 189 is opened. Nitrogen flows into the tank to purge atmospheric air. As this occurs, the condenser exhaust valve 216 is momentarily opened to exhaust atmospheric air. After atmospheric air is purged, the valves 189 and 216 are closed.

The tank 142 is filled with fluid by opening the breather valve 198, and the tank fill valves 185. The delivery pump 196 is switched on, and fluid is pumped from the reclaim tank 194 through the fill lines 204, filters 202, valves 185, and into the tank 142 via the fill ports 182. The cleaning fluid is preferably hydrofluoroether (HFE) ($C_4F_9OCH_3$, Methyl Nonafluorobutyl Ether), available from 3M Corporation, St. Paul, Minn.

The ultrasonic transducer 180 is energized. The doors 125 are ultrasonically cleaned in the tank 142. After cleaning is completed, the breather valve 198 and the drain valve 195 are opened. The fluid flows from the process tank 142 back into the reclaim tank 194, via gravity.

The foregoing steps of filling the process tank 142, ultrasonically cleaning, and draining the process tank are advantageously repeated for a desired number of cycles.

The HFE is condensed in a reclaim cycle. With the exhaust valve 212 closed, the condenser exhaust valve 216, and the nitrogen purge valve 189 are opened for a predetermined interval and are then closed. Chilled water runs through the vapor condenser 194. Condensed vapor drains back into the reclaim tank 194 through the condensate return line 206. Uncondensed vapor is exhausted through the exhaust line 214.

The elevator motor 162 is then energized in the reverse direction to raise the base 150 back up until it is about at the same level as the bench 132. This unseals the process tank. The tank enclosure door 148 is opened and the box doors 125 are removed from the base. Optionally, each door 125 may be reinstalled onto a box 52 on the work space 134, as the cleaned boxes 52 are removed in sequence from the box cleaner 32. Via appropriate sequencing, each door 125 can be reinstalled onto the specific box 52 which it originally was provided with.

To process the next batch of doors, the steps described above are repeated. The Nitrogen purge is preferably used between each batch of doors to keep condensed water out of the tanks and pipes.

Figure 11:
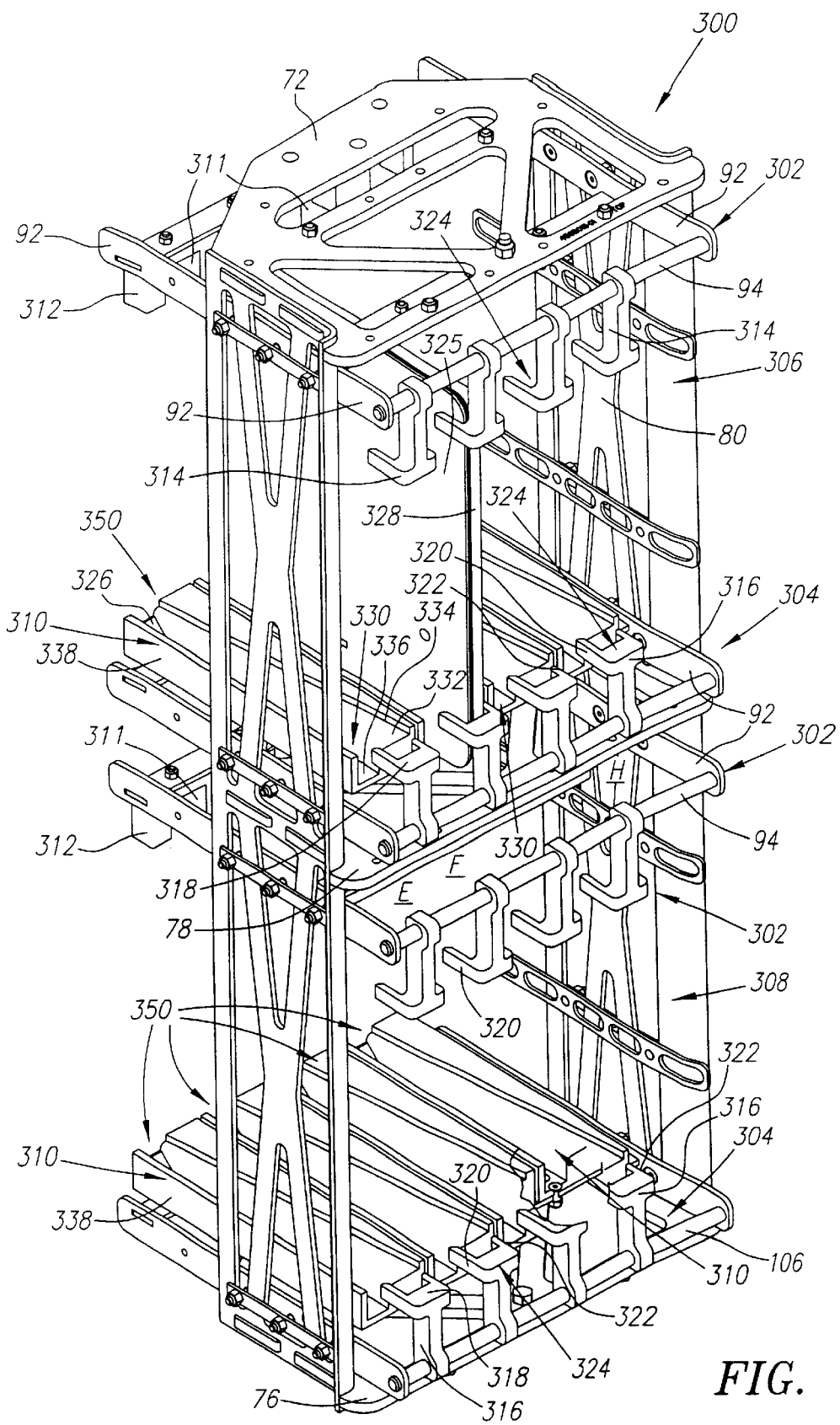
FIG. 11 is a perspective view of a box door holder assembly for use with the rotor shown in FIG. 2.
Figure 12:
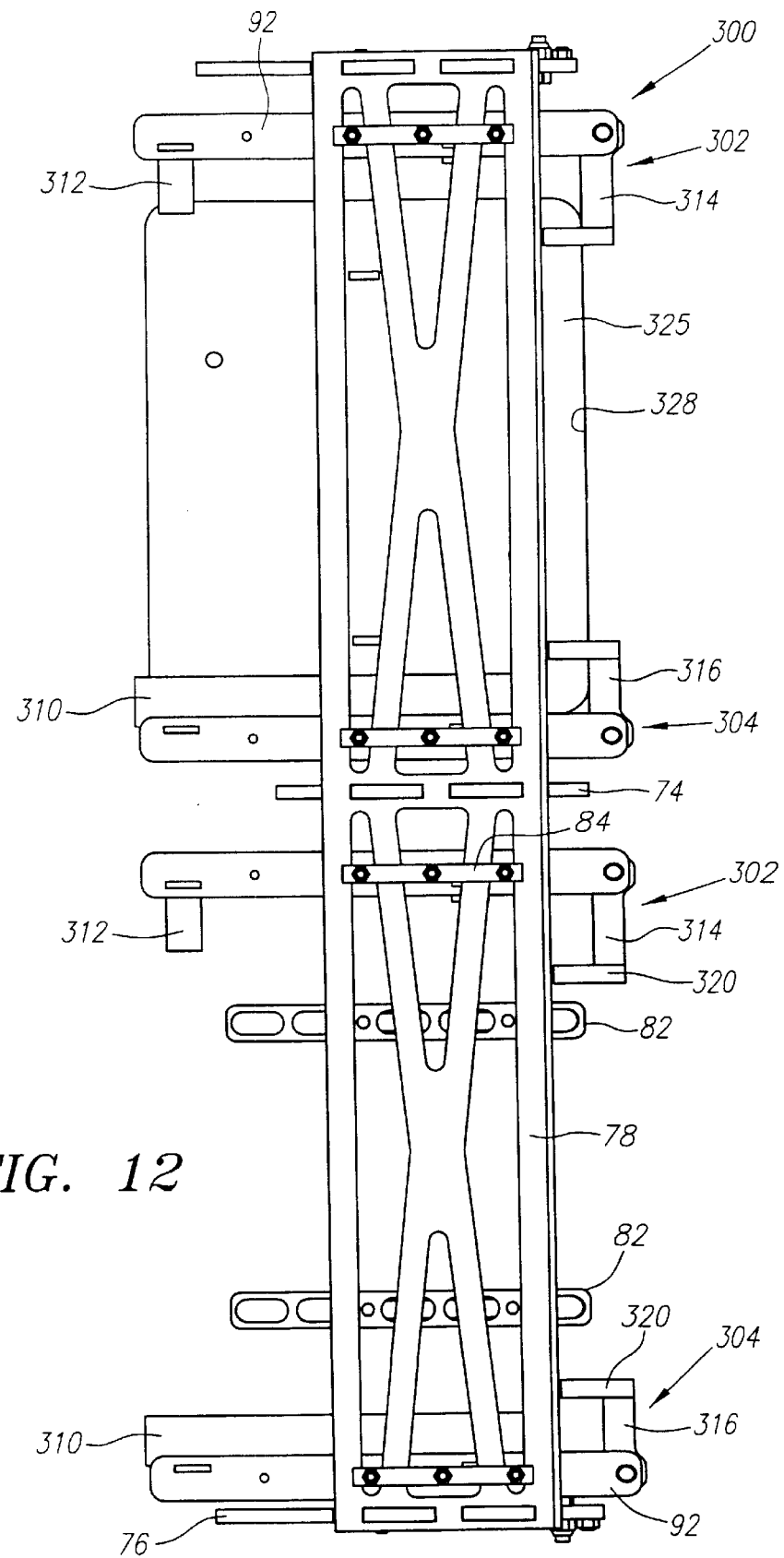
FIG. 12 is a side view thereof.

Certain carriers or boxes have doors which can be cleaned in a centrifugal cleaner. Referring to FIGS. 11 and 12, a door holder assembly 300 is provided on the rotor assembly 36, in place of one of the box holder assemblies 50, to form a modified carrier cleaning system which cleans both boxes and doors within the box cleaner 32. In such a system, the box cleaner 32 and its methods of use may be the same, as described above in connection with FIGS. 1–6, and with the separate box door cleaner described above with reference to FIGS. 7–10 not necessarily used.

The door holder assembly 300 has a middle plate 74, side plates 78 and 80, arms 92, upper cross bars and lower cross bars 106, as well as other components similar to the box holder assemblies 50, as shown in FIGS. 3 and 4.

Referring to FIGS. 2, 11 and 12, the door holder assembly 300 is rigidly attached to the top and bottom ring plates 60 and 62 of the rotor assembly 36, via bolts 75 extending through the top plate 72 and bottom plate 76 of the door holder assembly 300.

Referring to FIG. 11, the door holder assembly 300 has an upper compartment 306 and a lower compartment 308, generally separated by the middle plate 74. Each compartment 306 and 308 has an upper hook assembly 302 and a lower hook assembly 304.

Each upper hook assembly 302 includes a plurality of upper door hooks 314 and lower door hooks 316, preferably evenly spaced apart. Each of the upper and lower door hooks 314 and 316 has a fork head 318 including a long arm 320 and a short arm 322, forming a fork slot 324 between them.

Each of the compartments 306 and 308 preferably has four holding positions 350, with the door holding positions in the upper compartment indicated by A, B, C, and D, and with the door holding positions in the lower compartment indicated by E, F, G, and H. The door holding positions are preferably the same. In FIG. 11, a box door 325 is shown installed in the door holding position B.

A door guide 312 at the top back position of each of the compartments 306 and 308 has corner slots 311 which the upper back corner of the door 325 fits into, when the door 325 is installed into a door holding position. The door guide 312 helps to laterally support the doors (e.g., to hold the doors against side to side movement).

A door block 310 is aligned with a pair of upper and lower door hooks 314 and 316, at each door holding position 350. Referring still to FIG. 11, each door block 310 has a support wall 338 and an angle wall 334 extending at an acute angle to the support wall 338. A guide step 332 extends inwardly from the angle wall 334 towards the support wall 338. The guide step 332 is spaced apart from the support wall 338 by a slot bottom 336, with the guide step 332, slot bottom 336, and support wall 338 forming a guide slot 330.

Within each door holding position A–H, the fork slot 324 in the upper door hook 314, and in the lower door hook 316, is aligned with the guide slot 330 in the door block 310. The upper door hooks 314 are spaced apart from each other by a dimension which allows the door 325 to pass between them. The lower door hooks 316 are similarly spaced apart.

In use, to load doors 325 into the door holder assembly 300 on the rotor assembly 36, the enclosure door 40 is opened and the rotor assembly 36 is indexed or rotated until the door holder assembly 300 moves into alignment with the enclosure door 40. The doors 325 are then loaded into the door holder assembly 300 by hand.

Specifically, an operator moves a door 325 between the hooks 314 and 316, with the door 325 being guided radially inwardly (towards approximately the center of the rotor) at an acute angle to a radius of the rotor, by the angle guide wall 334. When the front edge 328 of the door 325 clears the short arm 322 of the hooks 314 and 316, the front edge 328 of the door 325 is then moved laterally (to the left in FIG. 11), causing the door 325 to move off of the guide step 332 and into the guide slot 330. The door 325 is then also aligned with the fork slots 324 in the door hooks 314 and 316. The operator then pulls the door 325 slightly forward, so that the front edge 328 of the door moves into the fork slots 324 and contacts the fork heads 318 of the door hooks 314 and 316.

The door 325 is then restrained against movement, during rotation of the rotor assembly 36, by the door hooks 314 and 316 (which prevent outward radial movement). The door 325 is also restrained against lateral movement, as the bottom edge of the door in the guide slot 330 is laterally restrained between the support wall 338 and the guide step 332. The top back corner of the door 325 is also laterally supported with the corner slot 311 of the door guide 312. A backstop 326 at the back end of the door block 310 prevents the door 325 from moving too far inwardly, during installation.

Using the sequence described above, the door holder assembly 300 is loaded with doors 325, typically with four doors in the upper compartment 306, and four doors in the lower compartment 308. Referring momentarily to FIG. 2, as the door holder assembly 300 replaces one of the box holder assemblies 50, the rotor assembly 36 has four box holder assemblies 50, each carrying two boxes, for a total of eight boxes, and with the door holder assembly 300 carrying eight doors. As a result, eight boxes along with their doors can be cleaned in a single cycle of the cleaning system.

The doors 325 are unloaded from the door holder assembly 300 using the reverse of the sequence of steps described above.

Thus, novel container cleaning systems and methods have been shown and described. Various modifications and substitutions of equivalents may, of course, be made without departing from the spirit and scope of the invention. The invention, therefore, should not be restricted, except by the following claims, and their equivalents.

What is claimed is:

1. A system for cleaning boxes used for handling flat media with the boxes each having a door, said system comprising:
    a rotor rotatably mounted within an enclosure;
    spray nozzles in the enclosure for spraying fluid toward the rotor;
    at least one box holder assembly on the rotor having at least one position for holding a box; and
    at least one door holder assembly on the rotor, with the door holder assembly having at least one box door holding position.

2. The system of claim 1 with the rotor having four box holder assemblies and one door holder assembly.

3. The system of claim 2 with each box holder assembly having two positions for holding boxes.

4. The system of claim 2 with the rotor having one door holder assembly, with the door holder assembly having 8 positions for holding box doors.

5. The system of claim 4 with each door holding position having an upper door hook, a lower door hook, and a door guide.

6. The system of claim 5 with at least on of the upper door and the lower door hook having a fork head.

7. The system of claim 6 with the fork head having a long arm and a short arm and forming a fork slot between them.

8. The system of claim 5 with the door guide comprising an angle wall extending at an angle to a support wall.

9. The system of claim 1 with the door holder assembly comprising a left side plate and a right side plate attached to a top plate, a middle plate and a bottom plate, the left side plate, right side plate, top plate and middle plate forming an upper compartment, the left side plate, right side plate, middle plate and bottom plate forming a lower compartment, and with each compartment having a plurality of upper and lower door hooks and door guides.

10. A system for cleaning boxes used for handling flat media with the boxes each having a door, said system comprising:
    a rotor rotatably mounted within an enclosure;

spray nozzles in the enclosure for spraying fluid toward the rotor;

at least one box holder assembly on the rotor having at least one position for holding a box; and at least one door holder assembly on the rotor, with the door holder assembly having at least one box door holding position, each box door holding position having an upper door hook, a lower door hook, and a door guide.

11. The system of claim 10 with at least one of the upper door and the lower door hook having a fork head.

12. The system of claim 11 with the fork head having a long arm and a short arm and forming a fork slot between them.

13. The system of claim 10 with the door guide comprising an angle wall extending at an angle to a support wall.

14. A system for cleaning boxes used for handling flat media with the boxes each having a door, said system comprising:

a rotor;

spray nozzles positioned for spraying fluid toward the rotor;

door holding means on the rotor for holding one or more doors;

box holding means on the rotor for holding one or more boxes.

15. The system of claim 14 wherein the door holding means comprises:

a door holder assembly, with the door holder assembly having 8 positions for holding box doors.

16. The system of claim 15 with the door holder assembly comprising a left side plate and a right side plate attached to a top plate, a middle plate and a bottom plate, the left side plate, right side plate, top plate and middle plate forming an upper compartment, the left side plate, right side plate, middle plate and bottom plate forming a lower compartment, each compartment having a plurality of upper and lower door hooks and door guides.

17. The system of claim 16 with each box door holding position having an upper door hook, a lower door hook, and a door guide.

18. The system of claim 17 with at least one of the upper door and the lower door hook having a fork head.

19. The system of claim 18 with the fork head having a long arm and a short arm and forming a fork slot between them.

20. The system of claim 17 with the door guide comprising an angle wall extending at an angle to a support wall.

21. The system of claim 14 wherein the box holding means comprises a box holder assembly with each box holding assembly having two positions for holding boxes.

* * * * *